United States Patent

Drenten

[15] 3,643,204

[45] Feb. 15, 1972

[54] CONNECTOR FOR PRINTED WIRING BOARDS

[72] Inventor: Richard C. Drenten, Phoenix, Ariz.

[73] Assignee: Honeywell Information Systems Inc.

[22] Filed: June 5, 1970

[21] Appl. No.: 43,753

Related U.S. Application Data

[62] Division of Ser. No. 693,599, Dec. 26, 1967, Pat. No. 3,550,062.

[52] U.S. Cl. ..................339/17 L, 317/101 DH, 339/75 MP, 339/176 MP, 339/217 R

[51] Int. Cl. .........................................................H05k 1/02

[58] Field of Search...............317/99, 101 R, 101 C, 101 CB, 317/101 DH, 101 CC, 101 CW, 101 CM, 101 D; 174/68.5; 339/17 R, 17 C, 17 F, 17 L, 17 LM, 17 LC, 17 M, 17 N, 18 R, 18 B, 18 C, 75 MP, 91 R, 176 R, 176 M, 176 MF, 196 M, 198, 217 R, 252 R, 253 R, 256 R, 277 R

[56] References Cited

UNITED STATES PATENTS

| | | | |
|---|---|---|---|
| 3,475,657 | 10/1969 | Knowles | 339/176 MP X |
| 3,466,591 | 9/1969 | Ecclesia | 339/176 MP X |
| 3,173,732 | 3/1965 | James | 339/176 MP X |
| 3,129,990 | 4/1964 | Rice et al. | 339/17 LM |
| 3,062,913 | 3/1960 | Myrick | 339/17 LM X |

*Primary Examiner*—Marvin A. Champion
*Assistant Examiner*—Terrell P. Lewis
*Attorney*—Fred Jacob and Edward W. Hughes

[57] ABSTRACT

The connector and mounting device of this invention is used to mechanically and electrically interconnect a printed wiring board and a backpanel without the use of mounting devices (such as screws) in the contact area of the connector. The elimination of mounting devices permits greater packaging densities (closer spacing) of components on the printed wiring board. The connector comprises an elongated block of insulative material having plural transverse channels, a spring contact in each channel is affixed on one end thereof to the printed wiring board and the other end of the spring contact is yieldingly retained within the channel. Each contact is formed to provide an intermediate contact portion protruding exteriorly of the connector block. The printed wiring board with the connector attached as hereinbefore described is inserted into a U-shaped mounting device which holds and guides the assembly on the backpanel. A biasing retainer cap containing a waveform spring is attached to the mounting device so as to spring-load the printed wiring board connector assembly into conductive contact with the backpanel.

5 Claims, 6 Drawing Figures

INVENTOR
RICHARD C. DRENTEN

CONNECTOR FOR PRINTED WIRING BOARDS

CROSS-REFERENCE TO RELATED APPLICATION

This is a division of application Ser. No. 693,599, now U. S. Pat. No. 3,550,062 filed Dec. 26, 1967.

BACKGROUND OF THE INVENTION

This invention relates to connectors, and more particularly to a miniaturized connector for electrically attaching a printed wiring board to a backpanel.

FIELD OF THE INVENTION

One of the primary objectives in the design of modern electronic equipment is to increase their electronic operating speeds, and since electronic signals travel at approximately 13 inches per nanosecond, the trend is to shorten the distances that the signals must travel.

New manufacturing techniques have reduced the size of individual elements such as resistors, capacitors, diodes and the like. Other technological advances have resulted in the creation of so-called micromodules and microminiature circuits, all in an attempt to decrease the signal travel time within the individual components.

The achievement of high-speed operation of electronic equipment depends not only on signal travel time within the components, but also on the distances between the components. The miniaturization of components has not only decreased the signal travel time within the components, it has also permitted higher packaging densities (closer spacing) of the components on the printed wiring boards, thus decreasing signal travel time between components.

The printed wiring boards are mounted on an electrical interconnecting medium referred to as a motherboard or backpanel, and to decrease the signal travel time between the printed wiring boards, they are physically mounted as close together as possible.

The increased packaging densities of modern high-speed electronic equipment has created the need for a connector to interconnect the printed wiring board and the backpanel which will aid in increasing the packaging densities.

DESCRIPTION OF THE PRIOR ART

Prior art connectors for interconnecting a printed wiring board and a backpanel, as exemplified by U.S. Pat. No. 3,173,732, comprise elongated insulator blocks having spring contacts retained within transverse grooves or channels formed along the length of the blocks. These spring contacts protrude outwardly from the grooves for electrically connecting the various conductors on the printed wiring board to the backpanel.

The mounting of these prior art connectors to the printed wiring boards is accomplished by screws passing through predrilled holes in the printed wiring board and threading into captive nuts embedded within the insulator block. The attachment of the connector to the backpanel is accomplished in the same manner. The elongated shape of the insulator block requires that a plurality of the captive nuts be utilized at spaced intervals along the length of the block to reduce its warping and bowing and thus hold the spring contacts in conductive contact with the printed wiring board and with the backpanel. These prior art connectors are structurally weak and subject to breakage due to the reduced cross sectional area of the insulative material in the proximity of the embedded nuts. The mounting nuts embedded at spaced intervals along the insulator block of the prior art connectors consume valuable space that would otherwise contain spring contacts, thus imposing a packaging limitation on the printed wiring boards and backpanel assembly by requiring corresponding empty spaces on the wiring boards and backpanel adjacent the captive nuts.

SUMMARY OF THE INVENTION

In accordance with the claimed invention, an improved printed wiring board connector is provided in which a spring contact yieldingly protrudes from each of a plurality of transverse channels formed along an elongated insulator block. One end of each of the spring contacts is affixed to the printed wiring board, thereby mechanically and electrically uniting the printed wiring board and the connector without employing captive nuts within the insulative block.

To mount the aforementioned printed wiring board and connector to the backpanel, a mounting connector.

Another object of this invention is to provide an improved wiring board connector in which a mounting device is attached to the backpanel and comprises a frame which engages the edges of the printed wiring board and spring-loads it and the spring contacts of the connector into conductive contact with the backpanel.

It is, therefore, one object of this invention to provide an improved printed wiring board connector in which a maximum number o f spring contact elements per unit length are assembled.

A further object of this invention is to provide an improved printed wiring board connector employing spring contact elements which are affixed to the printed wiring board.

A still further object of this invention is to provide an improved wiring board connector for use with a mounting device which maintains a constant and even spring contact pressure with a backpanel.

The foregoing and other object of this invention, the various features thereof as well as the invention itself, may be more fully understood from the following description when read together with the accompanying drawings, in which:

DESCRIPTION OF THE PREFERRED EMBODIMENT

Figure 1:
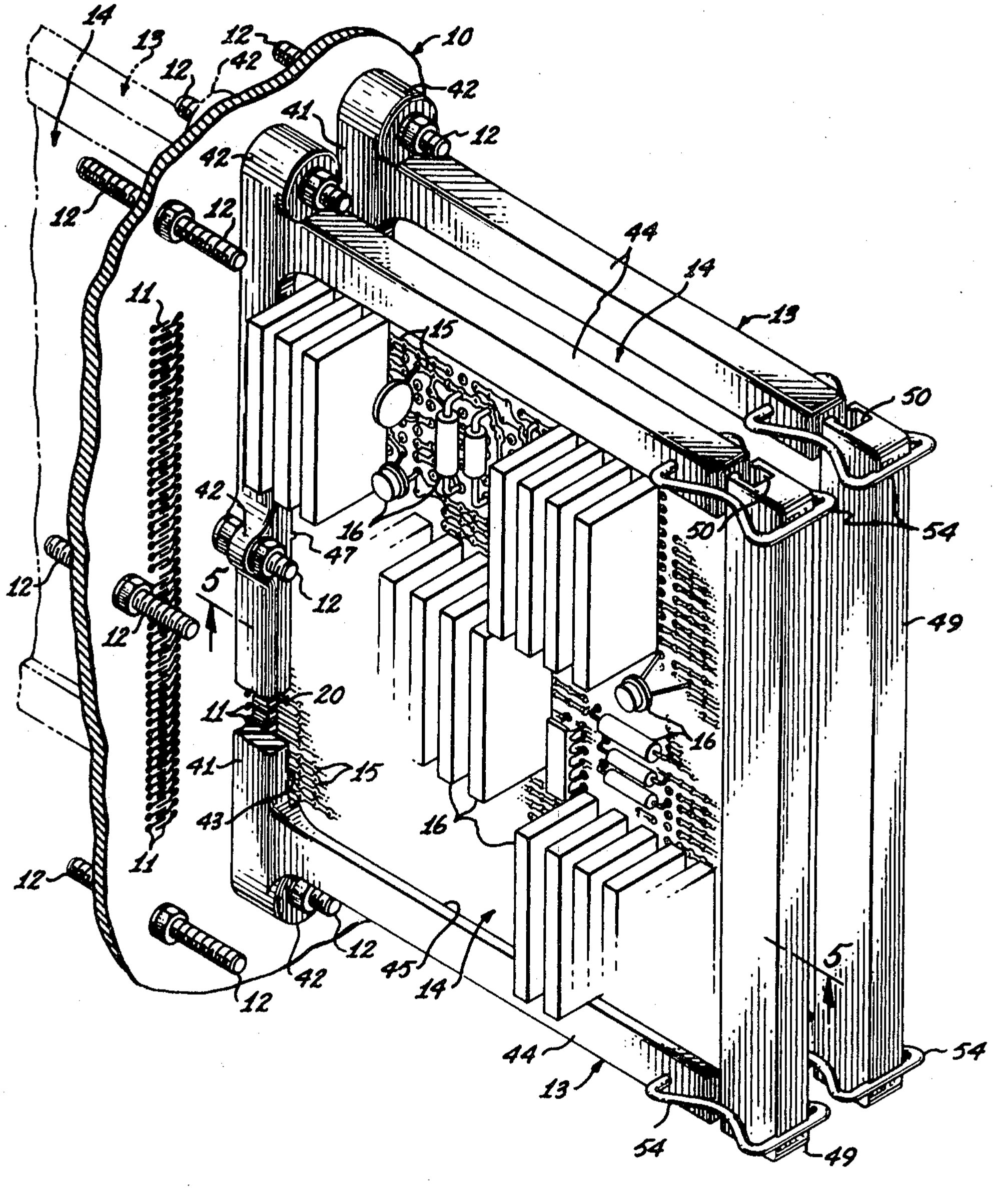
FIG. 1 is a fragmentary perspective view illustrating the features of the present invention.

Referring more particularly to the drawings by characters of reference, FIG. 1 illustrates a fragmentary portion of a backpanel 10 having a plurality of contact terminals 11 and mounting studs 12 arranged thereon and to which is attached a mounting device 13 incorporating features of this invention. The mounting device 13 is adapted to retain a printed wiring board 14 in contact with the backpanel 10.

Figures 2, 3, 4, 5, 6:
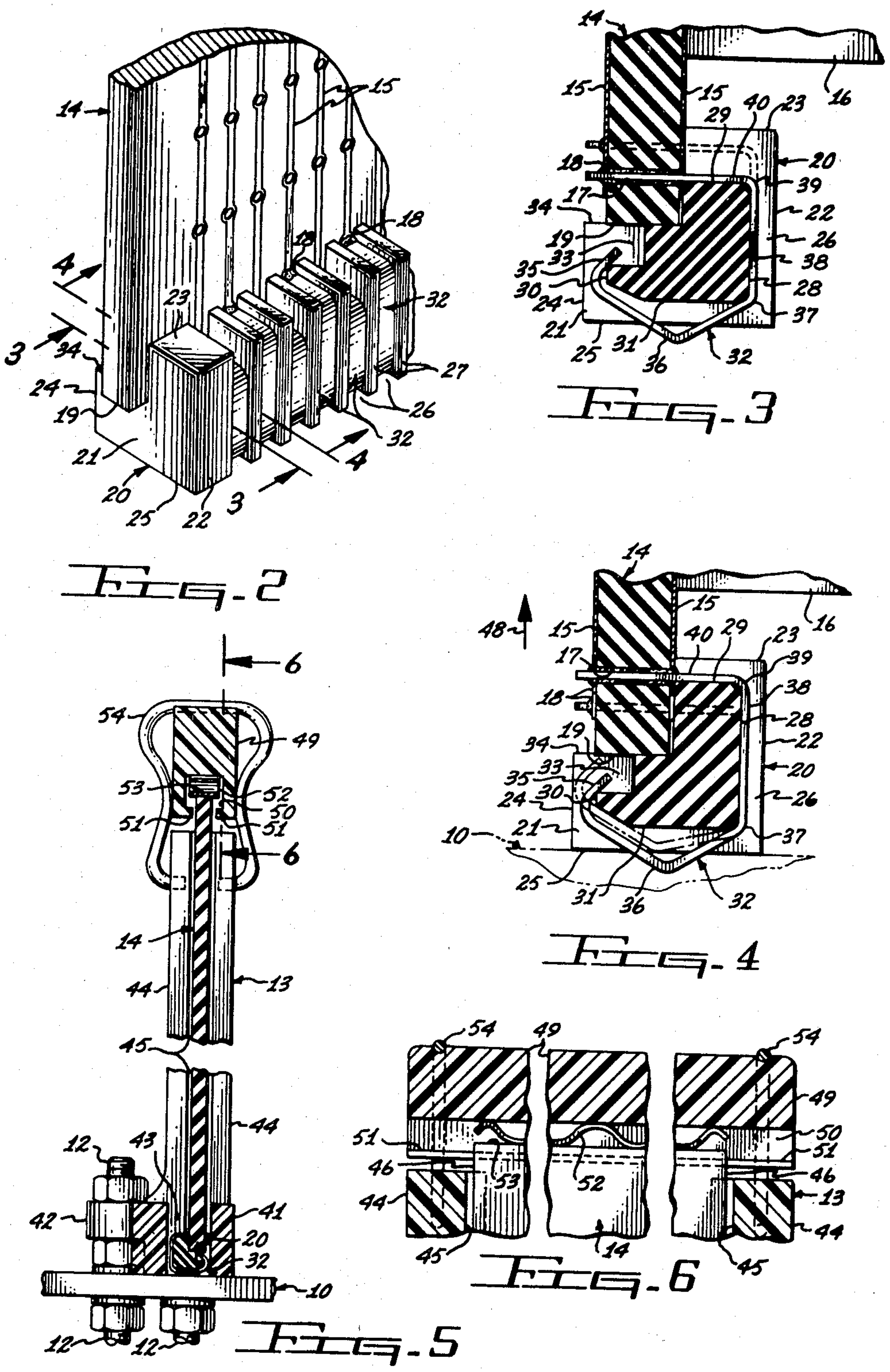
FIG. 2 is a fragmentary perspective view of the printed wiring board and connector.
FIG. 3 is an enlarged fragmentary sectional view taken on the line 3—3 of FIG. 2.
FIG. 4 is an enlarged fragmentary sectional view taken on the line 4—4 of FIG. 2.
FIG. 5 is an enlarged fragmentary sectional view taken on the line 5—5 of FIG. 1.
FIG. 6 is an enlarged fragmentary sectional view taken on the line 6—6 of FIG. 5.

The printed wiring board 14 is provided with wire runs 15 for electrically interconnecting a plurality of components 16 mounted thereon. As shown in FIGS. 3 and 4, each wire run 15 is provided with a hole 17 in its terminal end 18 arranged adjacent a backpanel abutting edge 19 of the printed wiring board.

A connector 20 incorporating part of the features of this invention is mounted on edge 19 of the printed wiring board so as to provide electrical continuity between the terminal ends 18 of the printed wiring board 14 and the contact terminals 11 of the backpanel 10 when the printed wiring board 14 is retained within the mounting device 13.

Connector 20, as best seen in FIGS. 2, 3, 4 and 5, comprises an elongated block 21 which is molded or otherwise formed of synthetic resinous compositions having good insulating qualities such as the well-known product sold under the trademark Lexan. This product, when used in molding block 21, may include reinforcing fibers. Block 21 may be of any desired length and is of substantially square cross section with faces 22, 23, 24 and 25 forming its peripheral surfaces. A plurality of channels 26 are cut or otherwise spacedly formed within faces 22, 23, 24 and 25 along the length of block 21 and transversely to its longitudinal axis. The channels are separated by lands 27 which form parts of the faces. Each channel is of sufficient size to receive a spring contact 32. The bottom of each channel is arranged to form a recess 33 extending inwardly toward the center of block 21 in a portion 30 thereof. A notch 34 is formed in faces 23 and 24 longitudinally of block 21 and is adapted to receive edge 19 of the printed wiring board 14.

The spring contact 32 provided in each channel 26 is formed of a strip of resilient material with good conductive properties such as beryllium copper. Each spring contact is preformed to provide a hooked end 35 which is turned into and yieldingly retained by recess 33. Each spring contact 32 is provided with a V-shaped contact portion 36 adjacent to its hooked end which is deformed to extend outwardly of surface 25 of block 21. Each contact is bent along its length at area 37 to provide a flat portion 38 which engages with and hugs a part 28 of the bottom of channel 26. Another bend in area 39 of spring contact 32 provides an extended end portion 40 which engages another part 29 of the bottom of channel 26 and projects into notch 34.

When the edge 19 of the printed wiring board 14 is inserted into notch 34 of block 21, ends 40 of spring contacts 32 arranged in each of channels 26 pass through holes 17 in terminal ends 18 of wire runs 15 of the printed wiring board. Soldering or other attaching means secures the ends 40 of the spring contacts within holes 17 to firmly affix connector 20 to the printed wiring board 14 as well as providing electrical continuity between the wire runs 15 and the spring contacts 32.

The mounting of spring contacts 32, as hereinbefore described, biases contact portions 36 otuwardly of surface 25 of block 21. As best seen in FIG. 4, when contact portions 36 are depressed from the solid line position to the broken line position, any lost motion of the spring contacts is absorbed by their hooked ends 35 moving within recesses 33 of channels 26.

The printed wiring board 14 with connector 20 affixed thereto is mounted on backpanel 10 by means of the mounting device 13. As best seen in FIGS. 1, 5 and 6, mounting device 13 comprises a base 41 having integrally formed bosses 42 for demountably attaching the mounting device to the studs 12 of backpanel 10. The base 41 is further provided with a longitudinal slot 43 which receives and positions connector 20. At opposite ends of base 41 are spacedly arranged guide arms 44, each provided with an inwardly facing groove 45. The guide arms 44 and their grooves 45 are suitably spaced to receive side edges 46 of the printed wiring board 14 and to slidably guide edges 46 into position within mounting device 13.

The attachment of the mounting device 13 on the backpanel 10 as hereinbefore described, is designed to precisely position the mounting device so that the contact terminals 11 of the backpanel 10 are presented in the longitudinal slot 43 of base 41.

With the printed wiring board 14 positioned within the mounting device 13, and connector 20 inserted within the longitudinal slot 43 of the base 41, the contact portions 36 of spring contacts 32 will be in conductive contact with the terminals 11 of backpanel 10. The precise registration of each spring contact 32 with an aligned conductor terminal 11 is provided by the combination of grooves 45 formed in guide arms 44 which generally guide the printed wiring board 14 and its connector, and by an indexing key 47, FIG. 1, formed within longitudinal slot 43. Key 47 engages a predetermined channel 26 of block 21, from which spring contact 32 has been omitted.

The previously described depressing of spring contacts 32 into channels 26 creates a compression force in contacts 32 which biases the printed wiring board in the direction of arrow 48 shown in FIG. 4, thereby tending to disengage the spring contacts from terminals 11 of backpanel 10. To nullify this biasing force and compensate for other factors such as manufacturing tolerances and temperature variations of the printed wiring board assembly, the mounting device is provided with a biasing retainer cap 49. The retainer cap 49 is of substantially square cross section and defines a channel 50 formed along its length which is provided with inwardly facing ledges 51 along the longitudinal opening of the channel. As best seen in FIGS. 5 and 6, a waveform spring 52 is provided in channel 50 of cap 49, spring 52 being held in a preloaded condition by ledges 51. The retainer cap 49 is positioned and held in place by clips 54 pivotally mounted on the outermost ends of guide arms 44. The outermost edge 53 of printed wiring board 14 will enter channel 50 of cap 49 and engage spring 52 retained therein, thereby exerting a force on the printed wiring board 14 in the clamped position which is greater than, and opposite to, the biasing force of spring contacts 32.

The backpanel 10 is supplied with contact terminals (not shown) on the back surface, which are duplicates of the contact terminals 11 provided on the front surface. The terminals on the back surfaces provide the same electrical connections to the internal circuitry as do terminals 11 on the front surface of the backpanel. The duplicate terminals (not shown) permit the mounting device 13 and printed wiring board 14 to be removed from its normal position shown in solid lines of FIG. 1 and remounted in the broken line position, thus facilitating servicing and debugging of the equipment under normal operating conditions which could not be otherwise accomplished due to the close proximity of the numerous printed wiring boards 14 mounted on the front surface of backpanel 10.

While the principles of the invention have now been made clear in a preferred embodiment, there will be immediately obvious to those skilled in the art many modifications of structure, arrangement, proportions, the elements, materials, and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. A connector for rigid attachment to a laminated printed wiring board comprising: an elongated block of insulative material, a plurality of channels formed within said block and arranged transversely to the longitudinal axis of said block, a spring contact formed of a strip of resilient conductive material arranged within each of said channels, one end of said spring contact being extended for rigid fastening of said block to the printed wiring board for mechanical and electrical connection and means for yieldingly retaining the other end of said spring contact within said channel, said spring contact being performed between the ends thereof to provide a contact portion protruding exteriorly of said block, as extensions along the longitudinal axis of said block for contact with the face of a backpanel.

2. A connector as described in claim 1 wherein said means for yieldingly retaining said other end of said spring contact comprises a recess formed in the bottom of said channel.

3. A connector for a laminated printed wiring board comprising: an elongated block of insulative material, plural channels formed within said block and arranged transversely to the longitudinal axis of said block, said channels extending around at least a part of said block between lands thereof, a plurality of spring contacts formed of strips of resilient conductive material, one of said spring contacts being arranged within each of said channels, one end of each of said spring contacts being rigidly fastened to a wire run of the printed wiring board for mechanically and electrically uniting the connector and the printed wiring board, and means for yieldingly retaining the other end of each of said spring contacts within its channel, each of said spring contacts being preformed between the ends thereof to provide a contact portion protruding beyond a surface of said block in such a manner as to be engageable with the surface of a backpanel.

4. A connector as described in claim 3 wherein said means for yieldingly retaining said other end of each of said spring contacts comprises a plurality of recesses, one formed in the bottom of each of said channels, each of said recesses being of sufficient size to provide space for lost motion of said other end of said spring contact as said contact portion is depressed into its channel.

5. A connector for providing a set of spring contacts extending outwardly from a backpanel abutting surface (19) of a removable printed wiring board comprising: an elongated block of insulative material, said block having a notch portion for engaging surface to surface the backpanel abutting edge and an adjacent face of the printed wiring board, a plurality of channels formed within surfaces of said block and arranged transversely to the longitudinal axis of said block, said channels extending across the face of said block for abutting the backpanel and extending around said block to the face of the printed wiring board, a plurality of spring contacts formed of resilient conductive material, one of said spring contacts being arranged within each of said channels, said spring contacts closely fitting the bottom of the portions of said channels parallel to the wire runs around to the surface of the printed wiring board and having an end portion for extending through a hole through the printed wiring board, said contact spring end portion mechanically and electrically uniting the connector and the printed wiring board, each of said spring contacts being preformed between the ends thereof to provide a contact portion protruding beyond one of the surfaces (25) of said block.

* * * * *